(12) United States Patent
Martin

(10) Patent No.: US 10,176,983 B1
(45) Date of Patent: Jan. 8, 2019

(54) CHARGED PARTICLE INDUCED DEPOSITION OF BORON CONTAINING MATERIAL

(71) Applicant: LAWRENCE LIVERMORE NATIONAL SECURITY, LLC, Livermore, CA (US)

(72) Inventor: Aiden Alexander Martin, Walnut Creek, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 3 days.

(21) Appl. No.: 15/729,819

(22) Filed: Oct. 11, 2017

(51) Int. Cl.
*H01L 21/02* (2006.01)
*C23C 14/06* (2006.01)
*C23C 14/22* (2006.01)

(52) U.S. Cl.
CPC ...... *H01L 21/02266* (2013.01); *C23C 14/067* (2013.01); *C23C 14/221* (2013.01); *H01L 21/02175* (2013.01); *H01L 21/02205* (2013.01)

(58) Field of Classification Search
CPC .......... H01L 21/02329; H01L 21/0257; H01L 21/2652; H01L 21/26586; H01L 21/02205; C23C 14/30; C23C 14/067; C23C 14/221
See application file for complete search history.

(56) References Cited

U.S. PATENT DOCUMENTS

| | | | | |
|---|---|---|---|---|
| 5,374,318 A | * | 12/1994 | Rabalais | ................ C30B 23/02 428/469 |
| 9,123,506 B2 | | 9/2015 | Martin et al. | |
| 2010/0227430 A1 | * | 9/2010 | Pinchart | ................ C23C 16/24 438/96 |
| 2016/0002784 A1 | * | 1/2016 | Omstead | .......... C23C 16/45536 427/523 |
| 2016/0293380 A1 | | 10/2016 | Martin et al. | |

* cited by examiner

*Primary Examiner* — Caridad Everhart
(74) *Attorney, Agent, or Firm* — Eddie E. Scott

(57) ABSTRACT

A method for produce a boron containing film by admitting a gaseous boron precursor into a vacuum chamber containing a substrate and directing an electron beam or ion beam into the vacuum chamber onto to the surface of the substrate. The electron beam or ion beam dissociates the gaseous boron precursor at the surface of the substrate creating non-volatile fragments that bind to the substrate surface forming a boron containing film.

8 Claims, 5 Drawing Sheets

CHARGED PARTICLE INDUCED DEPOSITION OF BORON CONTAINING MATERIAL

STATEMENT AS TO RIGHTS TO APPLICATIONS MADE UNDER FEDERALLY SPONSORED RESEARCH AND DEVELOPMENT

The United States Government has rights in this application pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present application relates to deposition of boron and more particularly to charged particle induced deposition of boron containing material.

Related Application

Related disclosure is included in U.S. patent application Ser. No. 15/729,853 entitled "localized electron beam induced deposition of silicon carbide" filed Oct. 11, 2017. The disclosure of U.S. patent application Ser. No. 15/729,853 filed Oct. 11, 2017 and entitled "localized electron beam induced deposition of silicon carbide" is hereby incorporated herein in its entirety for all purposes by this reference.

State of Technology

This section provides background information related to the present disclosure which is not necessarily prior art.

Next generation applications for boron containing materials include laser targets, quantum photonics, super-conductors, electronics, optics, and high-temperature and reactive chemical environments. All these alluring applications are, however, overshadowed by fabrication challenges arising from instabilities produced during the thermally induced fabrication process which results in film delamination and cracking.

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the forms disclosed and the application covers all modifications, equivalents, and alternatives falling within the spirit and scope of the apparatus, systems, and methods as defined by the claims.

The inventor's disclosed methods produce a boron containing film. The methods include the steps of admitting a gaseous boron precursor into a vacuum chamber containing a substrate with a substrate surface wherein the gaseous boron precursor absorbs to the substrate surface and directing an electron beam or ion beam to the substrate surface wherein the electron beam or ion beam dissociates the gaseous boron precursor creating non-volatile fragments that bind to the substrate surface forming a boron film. The inventor's methods have use in electronics, optics, laser targets, neutron absorbers, high-temperature and chemical resistant ceramics and other applications.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

DETAILED DESCRIPTION OF SPECIFIC EMBODIMENTS

Figure 1:
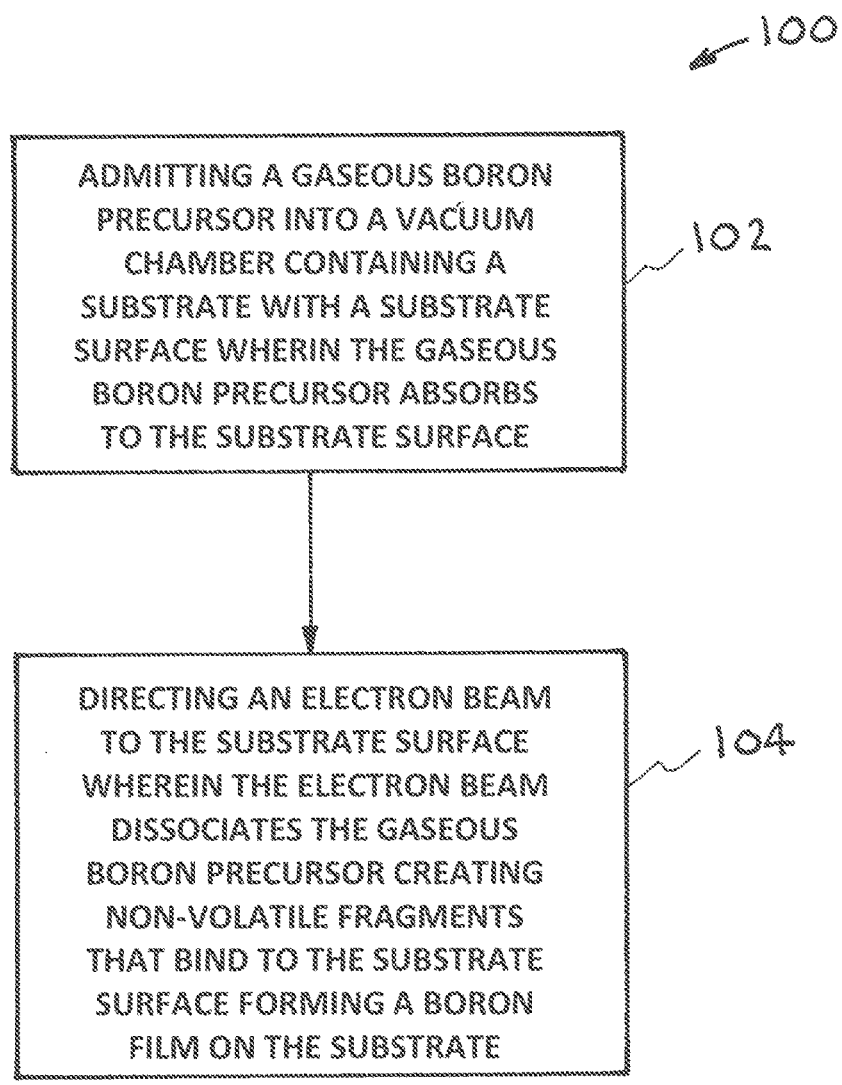
FIG. 1 is a flow chart illustrating one embodiment of the inventor's methods.

Referring to the drawings, to the following detailed description, and'to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

Electron beam induced deposition (EBID) is a rapidly developing technique that has been demonstrated for a wide range of materials. EBID avoids thermal and mass-transport related instabilities by overcoming the activation barrier for material deposition by electron induced dissociation of adsorbed precursor molecules. The inventors provide the first demonstration of deposition of boron containing material via the EBID process using trimethyl borate (TMB) precursor. Specifically, deposition mechanisms of boron oxide are presented as a function of substrate temperature using a novel large area deposition platform. The results show that the ligand type of the precursor molecule does not necessarily predict the mechanism of the EBID process and that deposition rates comparable to laser induced chemical vapor deposition (CVD) can be directly deposited on demand via the process.

EBID entails electron dissociation of precursor surface adsorbates into fragments that react with a solid surface.

Deposition occurs when the reaction products are non-volatile, resulting in the addition of surface material comprised of precursor molecule constituents. EBID is typically performed at or close to room temperature by injecting a precursor gas into a high or ultra-high vacuum chamber, while a substrate is irradiated by an energetic electron beam. The process has major advantages over thermal CVD processes including that the substrate is not exposed to the elevated temperatures required for the thermal decomposition of precursor molecules. Exposure to high temperatures is incompatible with many substrate materials and leads to the development of undesirable stresses often resulting in film cracking and delamination.

To date, deposition of boron containing material has not been demonstrated via the EBID process. This is a result of the majority of applications being targeted at the semiconductor industry including lithography mask repair and nanoscale fabrication. Materials generally studied include carbon, silicon, silica, various oxides, and a wide range of metals including germanium, gallium, tungsten, tin, titanium gold, nickel, iron, platinum, rhodium, iridium, cobalt, osmium, aluminum, chromium, and copper.

Referring now to the drawings, and in particular to FIG. 1, one embodiment of the inventor's methods for method of producing a boron containing film is illustrated by a flow chart. This embodiment is designated generally by the reference numeral 100. The flow chart 100 includes the steps listed below.

Step 102—admitting a gaseous boron precursor into a vacuum chamber containing a substrate with a substrate surface wherein the gaseous boron precursor absorbs to the substrate surface, and Step 104—directing an electron beam or ion beam to the substrate surface wherein the electron beam or ion beam dissociates the gaseous boron precursor creating non-volatile fragments that bind to the substrate surface forming a boron film.

The embodiment 100 of the inventor's methods for method of producing a boron film provides and electron beam or ion beam induced deposition (EBID) process wherein a gaseous trimethyl borate (TMB) precursor is admitted into the vacuum chamber where it adsorbs to the silicon substrate surface. An electron beam or ion beam dissociates adsorbed precursor molecules creating non-volatile fragments that bind to the surface forming a solid. The substrate is moved relative to the electron beam or ion beam to produce the boron film.

Figure 2:
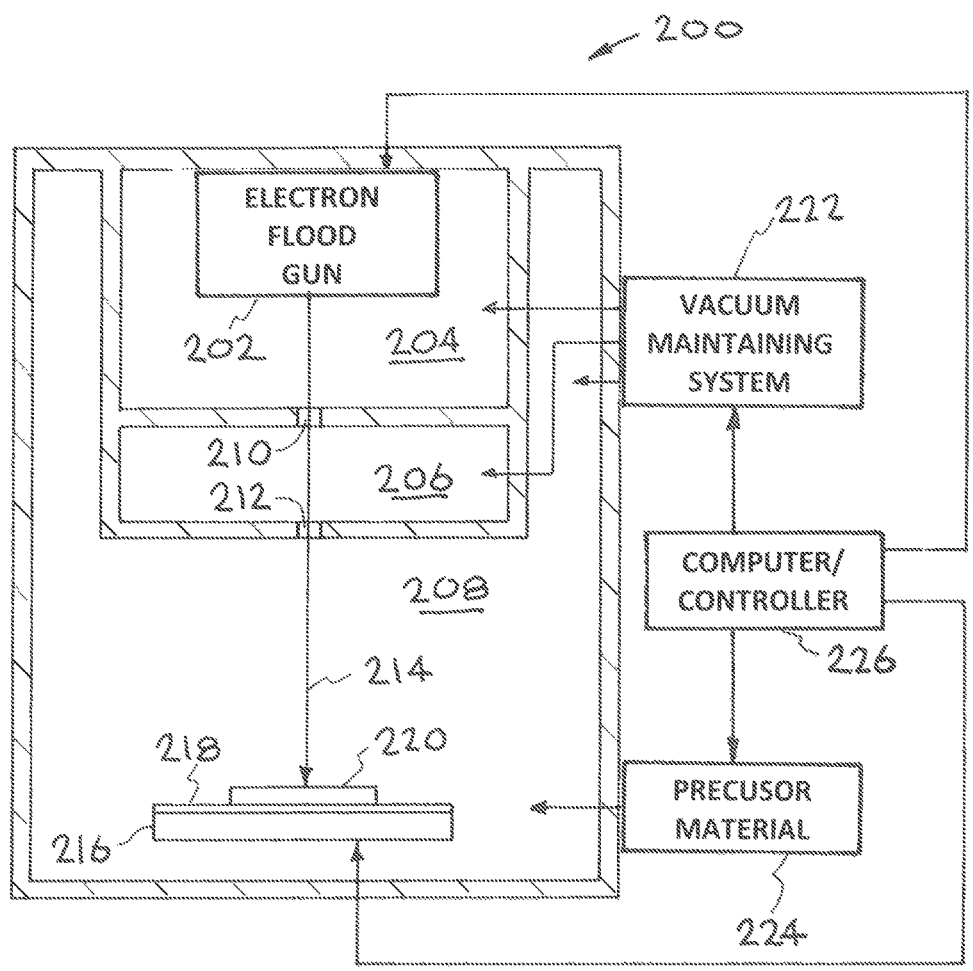
FIG. 2 is a schematic illustration of an electron beam or ion beam induced deposition system according to one embodiment of the invention.

Referring now to FIG. 2; an example embodiment of the inventor's systems for producing a boron film is illustrated. The system is designated generally by the reference numeral 200. The system 200 illustrated in FIG. 2 includes the components listed below.

Component 202—electron flood gun,
Component 204—first vacuum region,
Component 206—second vacuum region,
Component 208—third vacuum region,
Component 210—pressure limiting aperture,
Component 212—pressure limiting aperture,
Component 214—electron beam,
Component 216—x, y, z stage,
Component 218—heater,
Component 220—substrate,
Component 222—vacuum system,
Component 224—precursor material source, and
Component 226—computer/controller.

The system 200 utilizes an electron flood gun 202, heater assembly 218, substrate current measurement circuitry, and three differentially pumped vacuum regions (204, 206 and 208) which allows the electron optics to be maintained at high vacuum while the process chamber is on the order of 1 Pa. The system 200 operates by admitting a gaseous boron precursor into a vacuum chamber containing a substrate with a substrate surface wherein the gaseous boron precursor absorbs to the substrate surface, and directing an electron beam or ion beam to the substrate surface wherein the electron beam or ion beam dissociates the gaseous boron precursor creating non-volatile fragments that bind to the substrate surface to form a boron film. The substrate is moved relative to the electron beam or ion beam to produce the boron film.

Figure 3:
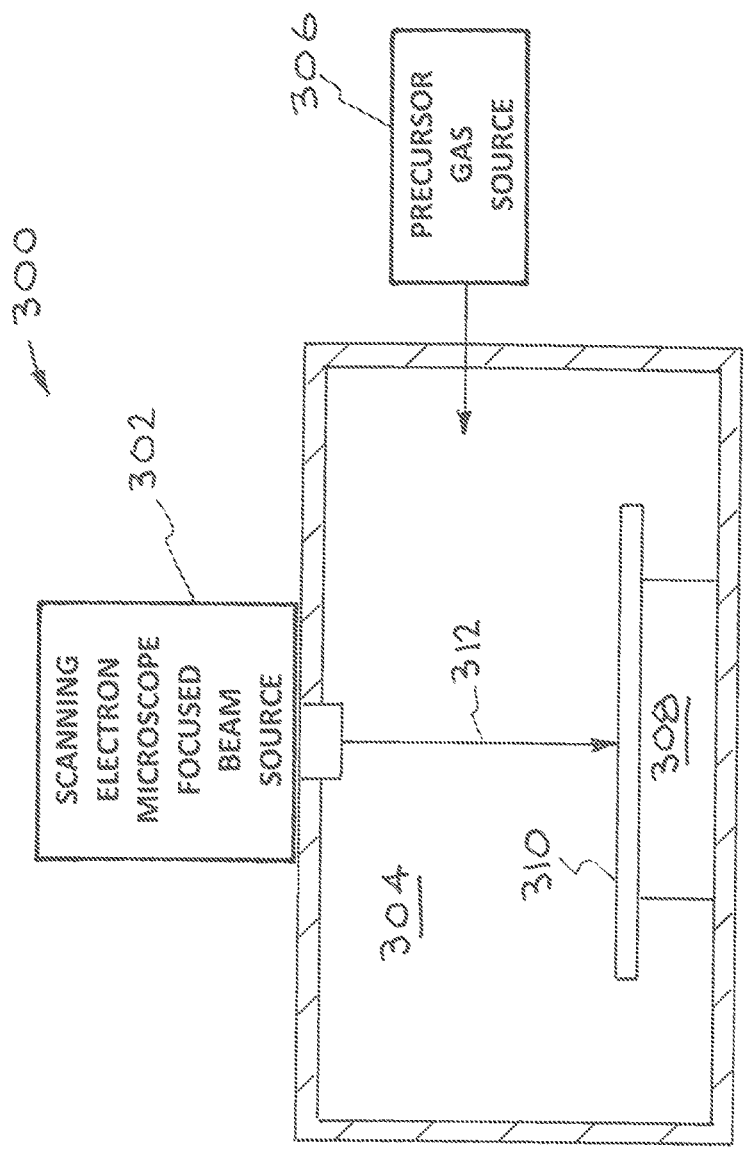
FIG. 3 is a schematic illustration of an electron beam or ion beam induced deposition system according to another embodiment of the invention.

Referring now to FIG. 3; another example embodiment of the inventor's systems for producing a boron film is illustrated. This embodiment system is designated generally by the reference numeral 300. The system 300 illustrated in FIG. 3 includes the components listed below.

Component 302—scanning electron microscope focused beam source,
Component 304—vacuum chamber,
Component 306—precursor material source,
Component 308—x, y, z stage,
Component 310—substrate, and
Component 312—electron beam.

The system 300 utilizes a focused beam source of a scanning electron microscope 302, a vacuum chamber 304, and a precursor material source 306. The system 300 operates by admitting the gaseous boron precursor into the vacuum chamber containing substrate 310 with a substrate surface wherein the gaseous boron precursor absorbs to the substrate surface, and directing the electron beam or ion beam 312 to the substrate surface wherein the electron beam or ion beam dissociates the gaseous boron precursor creating non-volatile fragments that bind to the substrate surface forming a boron film by moving the substrate 310 relative to the electron beam or ion beam 312 using x, y, z stage 308.

Figure 4:
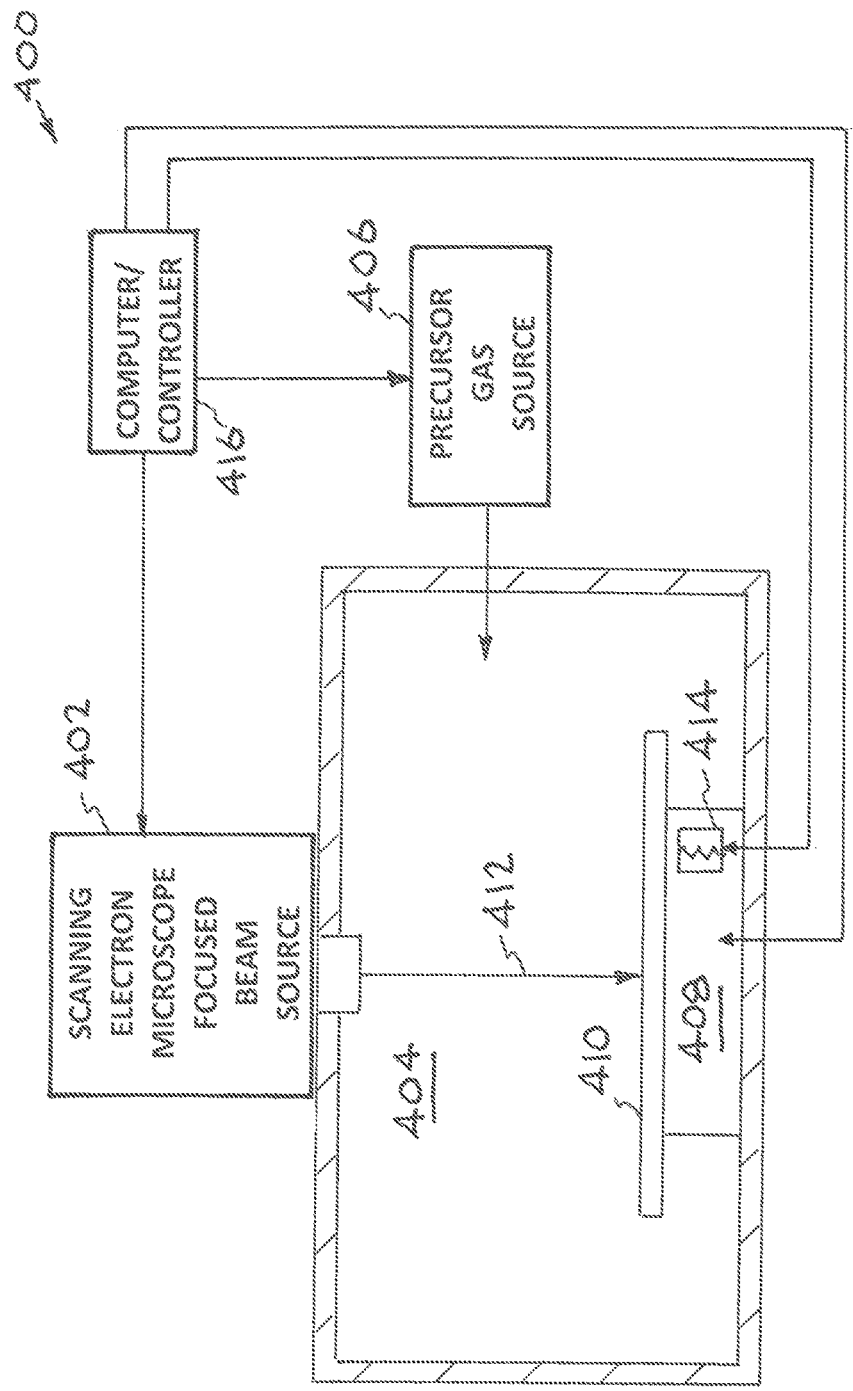
FIG. 4 is a schematic illustration of an electron beam or ion beam induced deposition system according to yet another embodiment of the invention.

Referring now to FIG. 4; another example embodiment of the inventor's systems for producing a boron film is illustrated. This embodiment system is designated generally by the reference numeral 400. The system 400 illustrated in FIG. 4 includes the components listed below.

Component 402—scanning electron microscope focused beam source,
Component 404—vacuum chamber,
Component 406—precursor material source,
Component 408—x, y, z stage,
Component 410—substrate,
Component 412—electron beam,
Component 414—heater, and
Component 416 computer/controller.

The system 400 utilizes a focused beam source of a scanning electron microscope 402, a vacuum chamber 404, a precursor material source 406, a substrate 410, and heater 414. The system 400 operates by admitting the gaseous boron precursor into the vacuum chamber containing the substrate 410 with a substrate surface wherein the gaseous boron precursor absorbs to the substrate surface, and directing the electron beam or ion beam 412 to the substrate surface wherein the electron beam or ion beam dissociates the gaseous boron precursor creating non-volatile fragments that bind to the substrate surface forming a boron film by moving the substrate relative to the electron beam or ion beam 412 using x, y, z stage 408. The computer/controller 416 is used to provide the steps of the inventor's methods.

Figure 5:
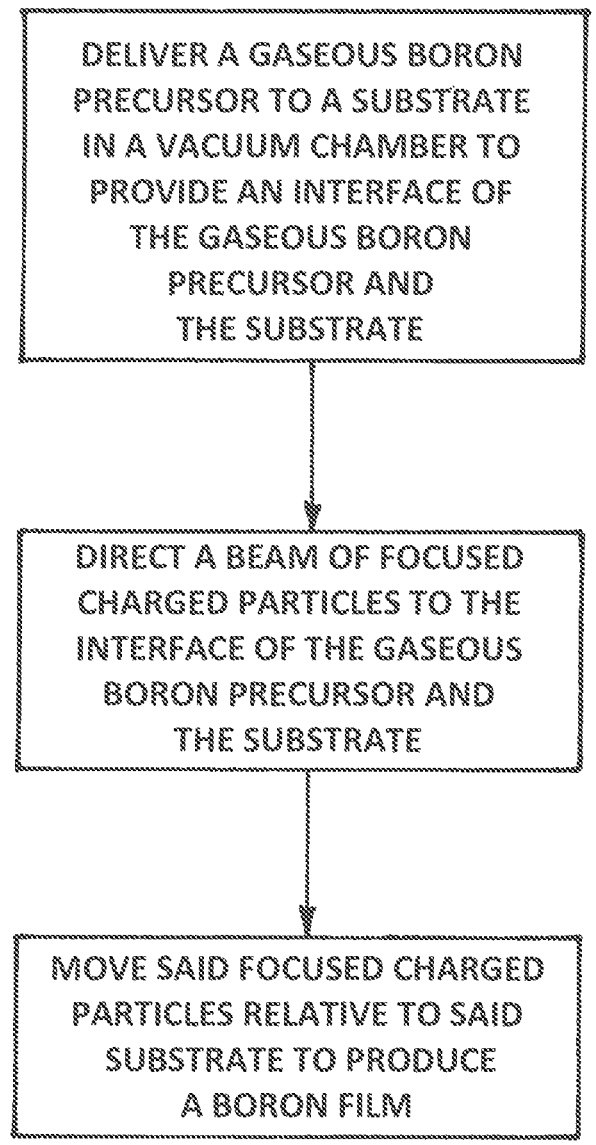
FIG. 5 is a flow chart illustrating another embodiment of the inventor's methods.

Referring now to FIG. 5, another embodiment of the inventor's methods for method of producing a boron film is illustrated by a flow chart. This embodiment is designated generally by the reference numeral 500. The flow chart 500 includes the steps listed below.

Step 502—deliver a gaseous boron precursor to a substrate in a vacuum chamber to provide an interface of a gaseous boron precursor and a substrate, Step 504—direct a beam of focused charged particles to the interface of the gaseous boron precursor and the substrate, and Step 506—move the beam of focused charged particles relative to the substrate to produce a boron film.

The embodiment 500 of the inventor's methods for method of producing a boron film provides and electron beam or ion beam induced deposition (EBID) process wherein gaseous TMB precursor is admitted into the vacuum chamber where it adsorbs to the silicon substrate surface. An electron beam or ion beam dissociates adsorbed precursor molecules creating non-volatile fragments that bind to the surface forming a solid. The substrate is moved relative to the beam of focused charged particles to produce a boron film.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments. Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

The invention claimed is:

1. A method of producing a boron film, comprising the steps of:

admitting a gaseous boron precursor into a vacuum chamber containing a substrate with a substrate surface wherein said gaseous boron precursor absorbs to said substrate surface, and directing an ion beam or an electron beam to said substrate surface wherein said step of directing an ion beam or an electron beam to said substrate surface comprises using a scanning electron microscope for directing an ion beam or an electron beam to said substrate surface and comprising the steps of:

admitting a gaseous boron precursor into a vacuum chamber containing a substrate with a substrate surface wherein said gaseous boron precursor absorbs to said substrate surface, and directing an ion beam or an electron beam to said substrate surface.

2. A method of producing a boron film, comprising the steps of:

admitting a gaseous boron precursor into a vacuum chamber containing a substrate with a substrate surface wherein said gaseous boron precursor absorbs to said substrate surface, and directing an ion beam or an electron beam to said substrate surface wherein said step of directing an ion beam or an electron beam to said substrate surface comprises using an ion beam microscope for directing an ion beam to said substrate surface and wherein said ion beam or electron beam dissociates said gaseous boron precursor creating non-volatile fragments that bind to said substrate surface forming a boron containing film.

3. A method of producing a boron film, comprising the steps of:

admitting a gaseous boron precursor into a vacuum chamber containing a substrate with a substrate surface wherein said gaseous boron precursor absorbs to said substrate surface, and directing an ion beam or an electron beam to said substrate surface wherein said ion beam or electron beam dissociates said gaseous boron precursor creating non-volatile fragments that bind to said substrate surface forming a boron containing film and wherein said step of directing an ion beam or an electron beam to said substrate surface comprises using an electron flood gun for directing an electron beam to said substrate surface.

4. A method of producing a boron film, comprising the steps of:

delivering a gaseous boron precursor to a substrate in a vacuum chamber thereby provide an interface of said gaseous boron precursor and said substrate in said vacuum chamber, directing focused charged particles to said interface of said gaseous boron precursor and said substrate, wherein said step of directing focused charged particles to said interface of said gaseous boron precursor and said substrate comprises directing focused electrons to said interface of said gaseous boron precursor and said substrate, and moving said focused charged particles relative to said substrate to produce the boron film.

5. A method of producing a boron film, comprising the steps of:

delivering a gaseous boron precursor to a substrate in a vacuum chamber thereby provide an interface of said gaseous boron precursor and said substrate in said vacuum chamber, directing focused charged particles to said interface of said gaseous boron precursor and said substrate, wherein said step of directing focused charged particles to said interface of said gaseous boron precursor and said substrate comprises using a scanning electron microscope for directing focused electrons to the said interface of said gaseous boron precursor and said substrate, and moving said focused charged particles relative to said substrate to produce the boron film.

6. A method of producing a boron film, comprising the steps of:

delivering a gaseous boron precursor to a substrate in a vacuum chamber thereby provide an interface of said gaseous boron precursor and said substrate in said vacuum chamber, directing focused charged particles to said interface of said gaseous boron precursor and said substrate, wherein said step of directing focused charged particles to said interface of said gaseous boron precursor and said substrate comprises using an electron flood gun for directing focused electrons to the said interface of said gaseous boron precursor and said substrate, and moving said focused charged particles relative to said substrate to produce the boron film.

7. A method of producing a boron film, comprising the steps of:

providing a gaseous boron precursor;

providing a vacuum chamber;

directing a beam of electrons or a beam of ions into said vacuum chamber;

providing a substrate, wherein said substrate has a substrate surface;

positioning said substrate in said vacuum chamber;

admitting said gaseous boron precursor into said vacuum chamber; and directing said beam of electrons or beam of ions in said vacuum chamber onto said gaseous boron precursor and onto said substrate surface wherein said gaseous boron precursor absorbs to said substrate surface and wherein said electron beam dissociates said gaseous boron precursor creating non-volatile fragments that bind to said substrate surface forming a boron film and wherein said steps of directing a beam of electrons or a beam of ions into said vacuum chamber and directing said beam of electrons or beam of ions in said vacuum chamber onto said gaseous boron precursor and onto said substrate surface comprises using a scanning electron microscope for directing a beam of electrons into said vacuum chamber and directing said beam of electrons in said vacuum chamber onto said gaseous boron precursor and onto said substrate surface.

8. A method of producing a boron film, comprising the steps of:

providing a gaseous boron precursor;

providing a vacuum chamber;

directing a beam of electrons or a beam of ions into said vacuum chamber;

providing a substrate, wherein said substrate has a substrate surface;

positioning said substrate in said vacuum chamber;

admitting said gaseous boron precursor into said vacuum chamber; and directing said beam of electrons or beam of ions in said vacuum chamber onto said gaseous boron precursor and onto said substrate surface wherein said gaseous boron precursor absorbs to said substrate surface and wherein said electron beam dissociates said gaseous boron precursor creating non-volatile fragments that bind to said substrate surface forming a boron film and wherein said steps of directing a beam of electrons or a beam of ions into said vacuum chamber and directing said beam of electrons or beam of ions in said vacuum chamber onto said gaseous boron precursor and onto said substrate surface comprises using an electron flood gun for directing a beam of electrons into said vacuum chamber and directing said beam of electrons in said vacuum chamber onto said gaseous boron precursor and onto said substrate surface.

* * * * *